US009267995B2

(12) United States Patent
Johnson et al.

(10) Patent No.: US 9,267,995 B2
(45) Date of Patent: Feb. 23, 2016

(54) METHODS AND SYSTEMS FOR DETERMINING WHETHER A VOLTAGE MEASUREMENT IS USABLE FOR A STATE OF CHARGE ESTIMATION

(71) Applicant: GM Global Technology Operations LLC, Detroit, MI (US)

(72) Inventors: Kurt M. Johnson, Brighton, MI (US); Brett B. Stawinski, Royal Oak, MI (US); Brian J. Koch, Berkley, MI (US); Damon R. Frisch, Troy, MI (US); Patrick Frost, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 594 days.

(21) Appl. No.: 13/717,958

(22) Filed: Dec. 18, 2012

(65) Prior Publication Data

US 2014/0172332 A1    Jun. 19, 2014

(51) Int. Cl.
*G01R 31/36* (2006.01)

(52) U.S. Cl.
CPC .......... *G01R 31/362* (2013.01); *G01R 31/3648* (2013.01)

(58) Field of Classification Search
CPC ..... G01R 31/362; G01R 31/3648; G01R 31/36
USPC .......................................................... 702/63
See application file for complete search history.

(56) References Cited

U.S. PATENT DOCUMENTS

| 7,768,233 | B2 | 8/2010 | Lin et al. | |
|---|---|---|---|---|
| 2011/0025270 | A1* | 2/2011 | Nakanishi | B60L 11/1851 320/116 |
| 2011/0095765 | A1* | 4/2011 | Tae | G01R 31/3658 324/434 |
| 2012/0299597 | A1* | 11/2012 | Shigemizu | H01M 10/441 324/428 |
| 2013/0043876 | A1* | 2/2013 | Liu | G01R 31/3624 324/426 |

* cited by examiner

*Primary Examiner* — Mischita Henson
*Assistant Examiner* — Ruihua Zhang
(74) *Attorney, Agent, or Firm* — Dinsmore & Shohl LLP

(57) ABSTRACT

Systems and methods for improvements in battery state of charge accuracy, charge termination consistency, capacity estimation, and energy delivery consistency. More specifically, embodiments herein detail systems and methods using an algorithm to calculate the change in state of charge for a given voltage change (dSOC/dV) at a given temperature in a region around the present voltage measurement or estimation and to set a signal indicating when the measurement should not be used due to potential error.

20 Claims, 6 Drawing Sheets

METHODS AND SYSTEMS FOR DETERMINING WHETHER A VOLTAGE MEASUREMENT IS USABLE FOR A STATE OF CHARGE ESTIMATION

FIELD

The present invention relates generally to systems and methods for improvements in battery state of charge accuracy, charge termination consistency, capacity estimation, and energy delivery consistency. More specifically embodiments herein detail an algorithm to calculate the change in state of charge for a given voltage change (dSOC/dV) at a given temperature in a region around the present voltage measurement or estimation and to set a signal indicating when the measurement should not be used due to potential error.

BACKGROUND

Knowing the state of charge of a battery is necessary for an indication of how much longer a battery will continue to perform prior to the need for either recharging or replacement. As technologies related to vehicles continue to advance, the significance of understanding and monitoring battery life becomes increasingly significant.

Battery charge can be measured through several methods, such as chemically, through measurements and plotting of curves related to discharge, or even using electrical modeling.

One known method of providing direct measurements is a method that converts a reading of the battery voltage to state of charge (SOC), using the known discharge curve (voltage versus SOC) of the battery. Using such a method SOC is graphed in relation to an open-circuit voltage (OCV) estimation which is the voltage at equilibrium and therefore current equals zero. With this method, however, the voltage reading is significantly affected by the battery current due to the battery's electrochemical kinetics as well as temperature, especially if the battery is not truly at rest when readings are made. Therefore such methods are often made more accurate by compensating the voltage reading with a correction term proportional to the battery current, and by using a look-up/reference table of the battery's open-circuit voltage estimation versus temperature.

In lithium iron phosphate batteries (LiFeP), regions of the SOC-OCV curve have large changes in SOC for small changes of OCV estimations. In these regions, voltage sensing inaccuracies, analog-to-digital (A/D) resolution, and controller area network (CAN) database resolution are some potential causes of SOC inaccuracy. There is a need in the art for systems and methods providing users with knowledge that an estimated SOC based on voltage in these regions may contain large errors and should not be used.

Current systems are exceedingly complex, and there is a need in the art for increased simplicity, efficiency and decreased errors. Specific embodiments described herein lead to improvements in SOC accuracy, charge termination consistency, capacity estimation, and energy delivery consistency.

SUMMARY

Embodiments of the present invention provide for determining whether a voltage measurement or an open-circuit voltage estimation is usable for a state of charge estimation. This method comprises providing at least one battery, at least one sensor coupled to said battery and at least one controller coupled to the at least one battery. The method additionally comprises sensing a temperature of the at least one battery with the at least one sensor, providing at least one of the voltage measurement or the open-circuit voltage estimation for the at least one battery, and starting an algorithm with the at least one controller. Specific embodiments of the algorithm involve creating an array of voltages from the provided voltage measurement or the open-circuit voltage estimation, a step size, and a total number of elements, as well as calculating the state of charge (SOC) for each voltage in the array given the sensed temperature, and calculating the difference between each subsequent state of charge (dSOC) in the array. Specific embodiments of the algorithm also comprise determining the maximum dSOC from the array, determining if the maximum dSOC is above a threshold for usable data, and setting an output to "not use the data" when the maximum dSOC is above the threshold for usable data, or setting the output to "use the data" when the maximum dSOC is not above the threshold for usable data.

Also provided herein are embodiments for novel systems for determining whether a voltage measurement or an open-circuit voltage estimation is usable for a state of charge estimation comprising at least one battery, at least one sensor coupled to said battery, and at least one controller coupled to the at least one battery. In specific embodiments the at least one sensor is configured to sense a temperature and provide the voltage measurement or the open-circuit voltage estimation of the at least one battery, and the at least one controller is configured to start an algorithm. More specifically, in various embodiments, the controller is configured to start the algorithm so as to create an array of voltages from the provided voltage measurement or the open-circuit voltage estimation, a step size, and a total number of elements. The algorithm also can calculate the state of charge (SOC) for each voltage in the array given the sensed temperature, calculate the difference between each subsequent state of charge (dSOC) in the array, and determine the maximum dSOC from the array. This allows for the algorithm to determine if the maximum dSOC is above a threshold for usable data and set an output to "not use the data" when the maximum dSOC is above the threshold for usable data, or setting the output to "use the data" when the maximum dSOC is not above the threshold for usable data.

DETAILED DESCRIPTION

Figure 1:
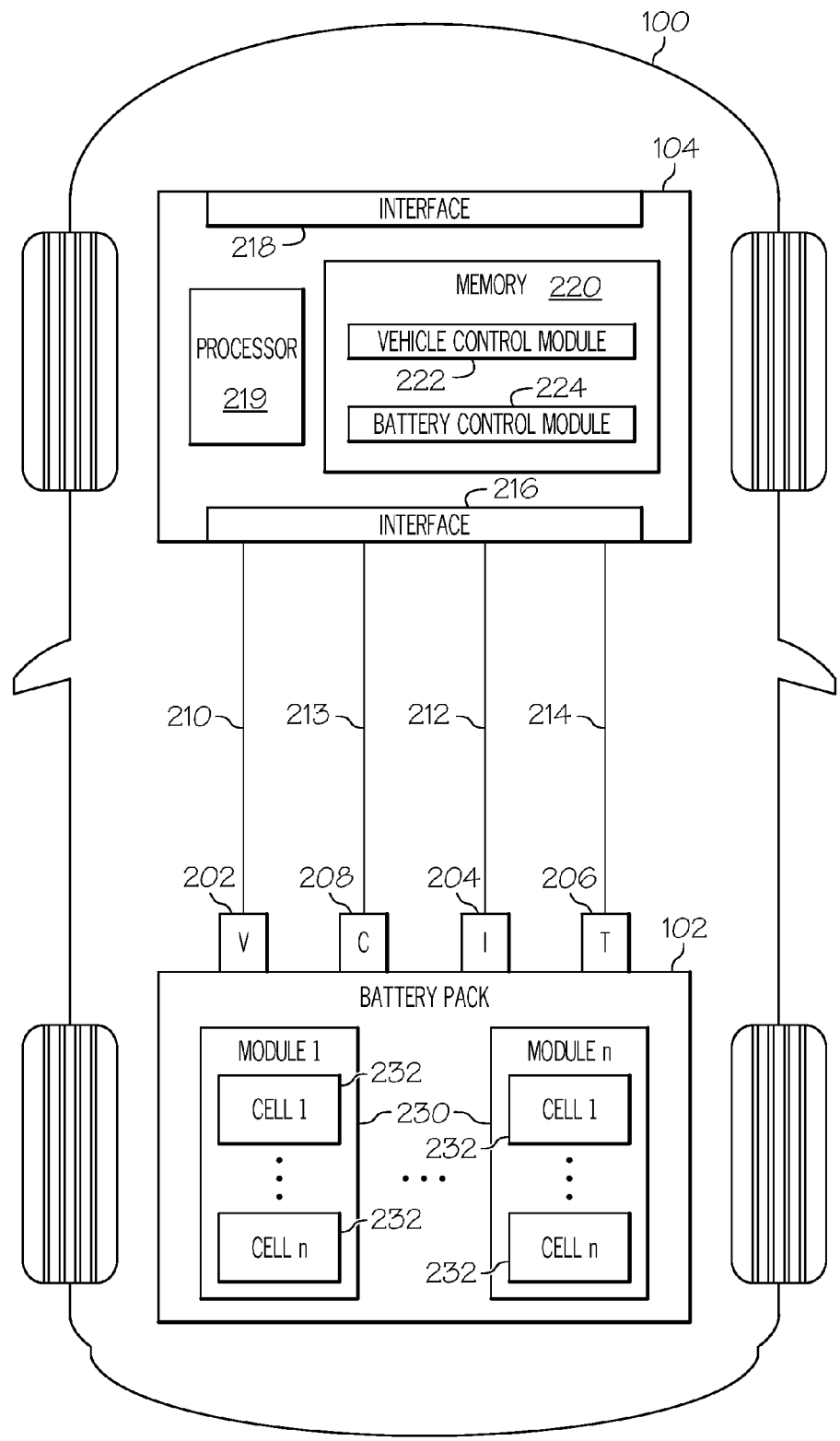
FIG. 1 is a schematic illustration of a system including a battery pack and a controller such as a controller located within a vehicle.

Specific embodiments of the present disclosure will now be described. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. The terminology used herein is for describing particular embodiments only and is not intended to be limiting of the invention. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about," which is intended to mean up to ±10% of an indicated value. Additionally, the disclosure of any ranges in the specification and claims are to be understood as including the range itself and also anything subsumed therein, as well as endpoints. Unless otherwise indicated, the numerical properties set forth in the specification and claims are approximations that may vary depending on the desired properties sought to be obtained in embodiments of the present invention. Notwithstanding that numerical ranges and parameters setting forth the broad scope of the invention are approximations, the numerical values set forth in the specific examples are reported as precisely as possible. Any numerical values, however, inherently contain certain errors necessarily resulting from error found in their respective measurements.

As used herein, the term "pack" is a combination of batteries/battery cells in series and parallel.

As used herein "OCV" is an open-circuit voltage estimation of a battery cell or pack. OCV is equal to the measured voltage when the cell or pack is at equilibrium.

As used herein, the term "signal" refers to a Boolean value or other designation, used in certain embodiments herein to designate whether an open-circuit voltage estimation should be used.

As used herein, the term "calculation device" refers to a computer or other device that can perform algorithms.

In specific embodiments the new algorithm (see FIG. 5 and Example 1) tests the SOC-OCV curve at voltages near the measurement and at the same temperature to determine the difference in SOC between these points. A small difference in SOC indicates that the error introduced by the measurement is likely small and should be trusted.

In specific embodiments of the invention, the present temperature of the battery is tested via one or more sensors also coupled to the controller so as to communicate information between parts of the system. By testing at the present temperature of the battery, the new algorithm can create the use/do not use signal at a higher resolution than could be performed with current methods.

FIG. 1 illustrates a system including a battery pack and a controller 104 located within a vehicle. A vehicle 100 is shown, according to an exemplary embodiment. Battery pack 102 includes modules 230, which provide cumulative electrical power to propel vehicle 100. Each of modules 230 contains a plurality of battery cells 232. Similarly, battery cells 232 are connected together to provide cumulative power at the module level of battery pack 102.

Vehicle 100 is also shown to include a number of sensors connected to battery pack 102. Voltage sensors 202 measure the voltage of battery pack 102, modules 230, and/or cells 232 and provides voltage values to interface 216 of controller 104 via bus line 210. Current sensors 204 measure the current of battery pack 102, modules 230, and/or cells 232 and provides current values to interface 216 of controller 104 via bus line 212. Temperature sensors 206 measures the temperature of battery pack 102, modules 230, and/or cells 232 and provides temperature values to interface 216 of controller 104 via bus line 214. Sensors 202, 204, and 206 may be any number of sensors or configurations to measure the voltages, currents, and temperatures associated with battery pack 102. For example, temperature sensor 206 may be a single temperature sensor, while voltage sensors 202 and current sensors 204 may be a combined integrated circuit that measures both voltages and currents. It should be appreciated that any number of different combinations of sensors and sensor configurations may be used, without deviating from the principles or teachings of the present disclosure.

The controller 104 can include an interface 218, memory 220, processor 219, vehicle control module, battery control module 224, and one or more interfaces (216, 218). In some embodiments, vehicle 100 may also include cell balancing controller 208, which performs cell balancing on battery pack 102 in response to receiving a control command from controller 104 via bus line 213. In other embodiments, cell balancing controller 208 is omitted and controller 104 may provide control commands directly to battery pack 102 via bus line 213, to perform cell balancing.

Still referring to controller 104, the controller 104 is shown to include processor 219, which may be one or more processors (e.g., a microprocessor, an application specific integrated circuit (ASIC), field programmable gate array, or the like) communicatively coupled to memory 220 and interfaces 216 and 218. Memory 220 may be any form of memory capable of storing machine-executable instructions that implement one or more of the functions disclosed herein, when executed by processor 519. For example, memory 520 may be a RAM, ROM, flash memory, hard drive, EEPROM, CD-ROM, DVD, other forms of non-transitory memory devices, or any combination of different memory devices. In some embodiments, memory 220 includes vehicle control module 222, which provides control over one or more components of vehicle 100. For example, vehicle control module 222 may provide control over the engine of vehicle 100 or provide status condition information (e.g., vehicle 100 is low on fuel, vehicle 100 has an estimated number of miles left to travel based on the present SOC of battery pack 102, etc.) to one or more display devices in the interior of vehicle 100 via interface 218. In some embodiments, vehicle control module 222 may also communicate with other processing circuits (e.g., an engine control unit, an on-board diagnostics system, or the like) or other sensors (e.g., a mass airflow sensor, a crankshaft position sensor, or the like) via interface 218.

In specific embodiments the controller 104 is located in different places in different applications, including in a car, such as in the passenger cabin and/or under seats and/or in a trunk. The controller 104 also can be located in a laboratory used herein to refer to a building or location utilized for testing equipment or performing other research or where manufacturing is performed. A signal of "use the data" or "not use the data" of a voltage measurement for SOC estimation as described herein can be automatically displayed on a car dash or other display for a user.

Figure 2:
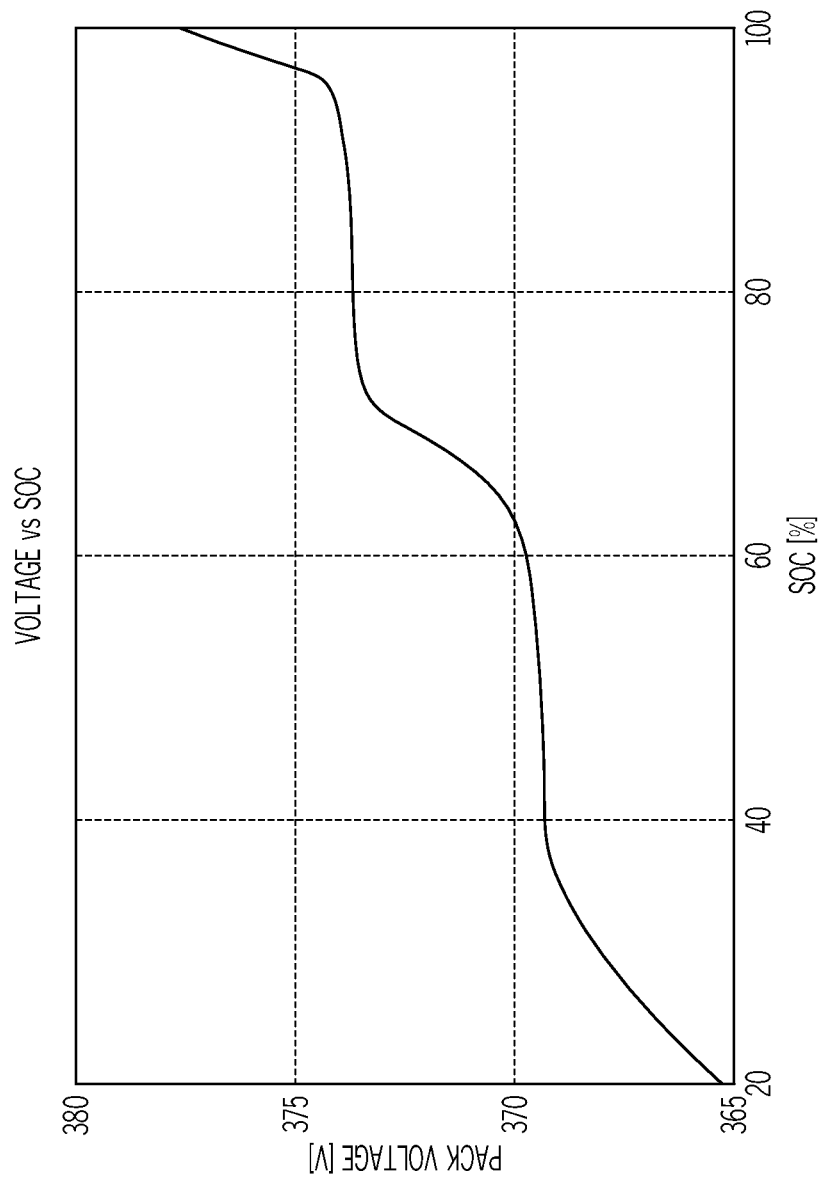
FIG. 2 is a schematic illustration of Pack Voltage versus SOC percentage for a lithium iron phosphate battery.

FIG. 2 shows a schematic illustration of Pack Voltage versus SOC percentage for a lithium iron phosphate battery. As can clearly be seen, FIG. 2 shows very large regions of SOC percentage changes with little change in voltage (SOC percentage of 40-60%, 70-95%). This graph shows that a change in voltage correlates very well for a change in SOC percentage when the line slope is steep, and very poorly when the line is flat (slope of nearly zero). For example, when the voltage changes from about 377 volts to about 375 volts, SOC percentage drops from only from about 100 to about 98 percent SOC. However as the voltage drops from about 375 volts to about 373 volts, the SOC percentage drops from about 98 to about 71. Therefore a given voltage reading or even a measure of a voltage change in the flat regions of the graph would not be an accurate way to calculate the change in state of charge. Embodiments herein described provide for a determination of when such data should be used and when it should not be used.

Figure 3:
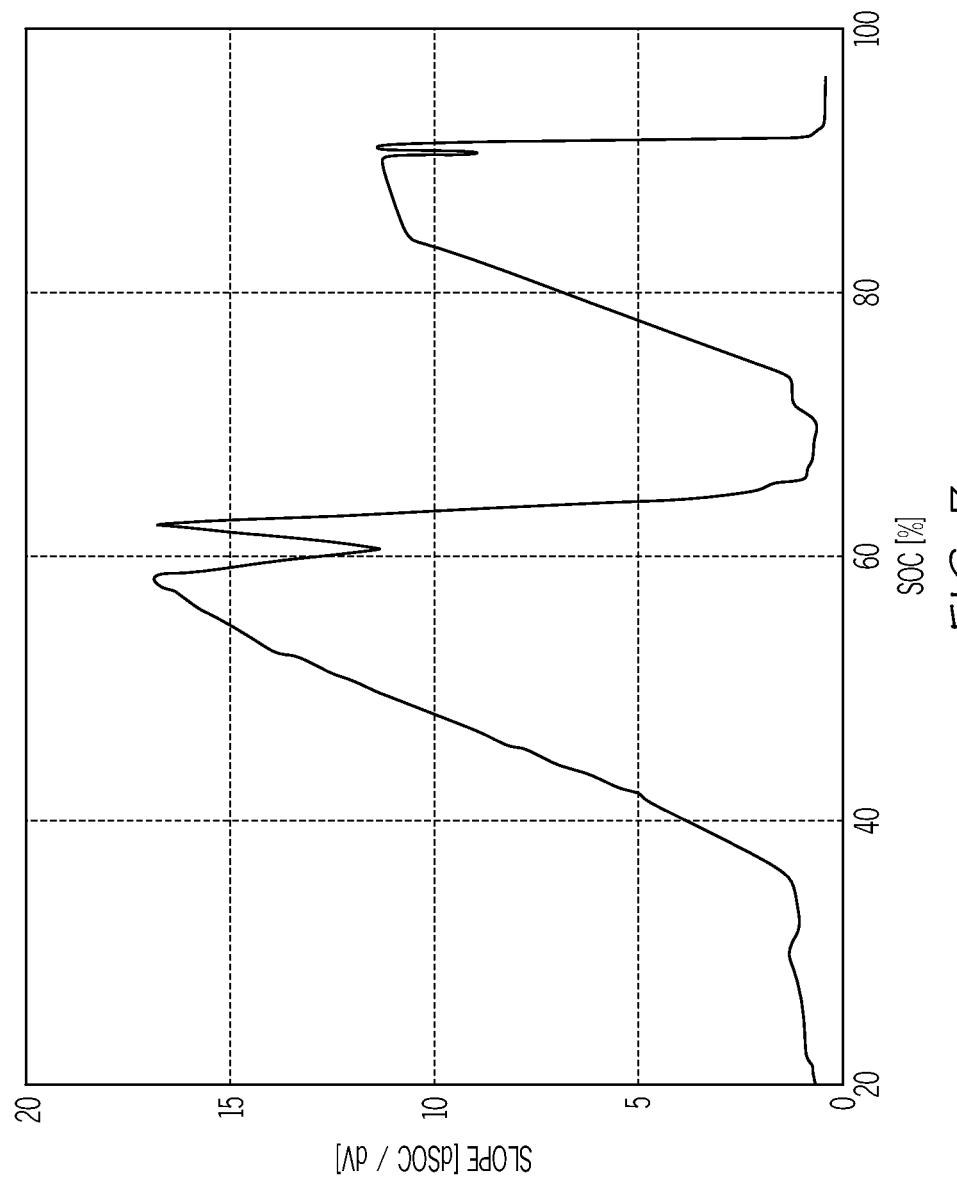
FIG. 3 is a schematic illustration of variance of the slope for one step size.

FIG. 3 is a schematic illustration of variance of the slope for one step size. This graph shows that as the SOC percentage falls from 100 to 0, the dSOC/dV can either be approximately flat (at near full charge or at very low charges) or can be very steep (at about 40-60 percent and at 70-95 percent). When the slope of the line this graph is steep, a given voltage measurement or measurement of voltage change would run the risk of being a poor estimate of a change in a SOC as the SOC is changing so rapidly around this voltage point. Therefore embodiments herein described account for this variability by accounting for the slope changes, and by estimating SOC using voltages higher and lower than the measurement using voltage steps.

Figure 4:
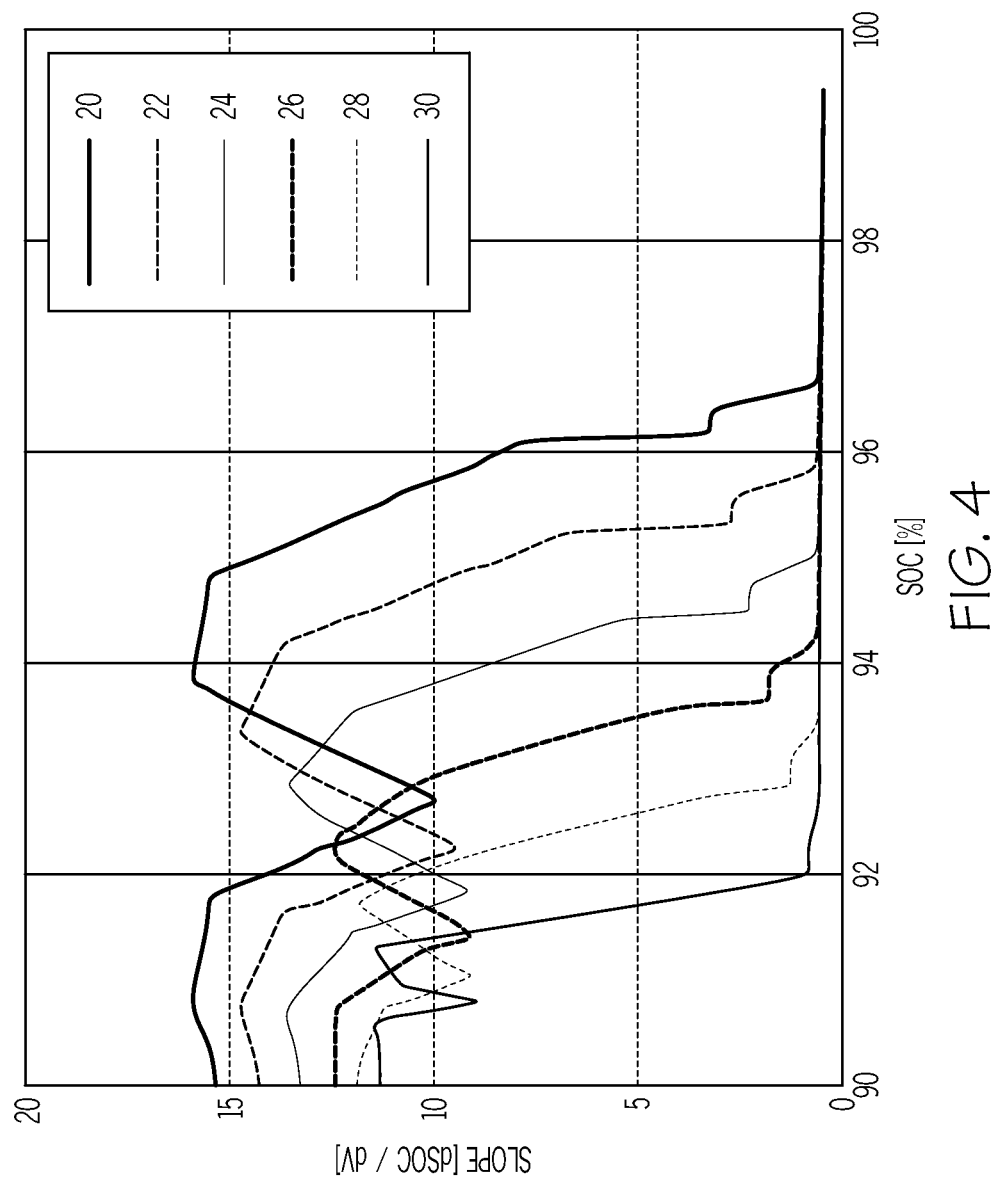
FIG. 4 is a schematic illustration of variance of the slope for a given step size with temperature.

FIG. 4 is a schematic illustration of variance of the slope for a given step size with temperature. In the same way that FIG. 3 showed 1 step size, this graph shows multiple step sizes, from 90 to 100 percent (unlike FIG. 3 which showed form 0 to 100 percent). FIG. 4 shows more than one step size and indicates temperature significance with measurements. FIG. 4 shows that temperature must be closely accounted for to determine accurate measurements. In the method being disclosed, the slope of the 20 degree Celsius dSOC/dV curve remains larger than the 30 degree Celsius dSOC/dV curve at higher states of charge. In prior art, temperatures between 20 and 30 degrees Celsius could be evaluated as equivalent resulting in the rejection of state of charge estimates with low error at higher temperatures.

Still regarding FIG. 4, FIG. 4 illustrates that it would be appropriate to use the OCV at 94% SOC if the temperature was greater than 26 degrees Celsius, but that a change in temperature could lead to significant error. As shown, as much as 15% SOC error could be introduced if the temperature was only 20 degrees Celsius. Likewise, given a temperature of 20 degrees Celsius, the OCV would have to show about 97 percent before it would have less than 2 percent error based on the curve.

Figure 5:
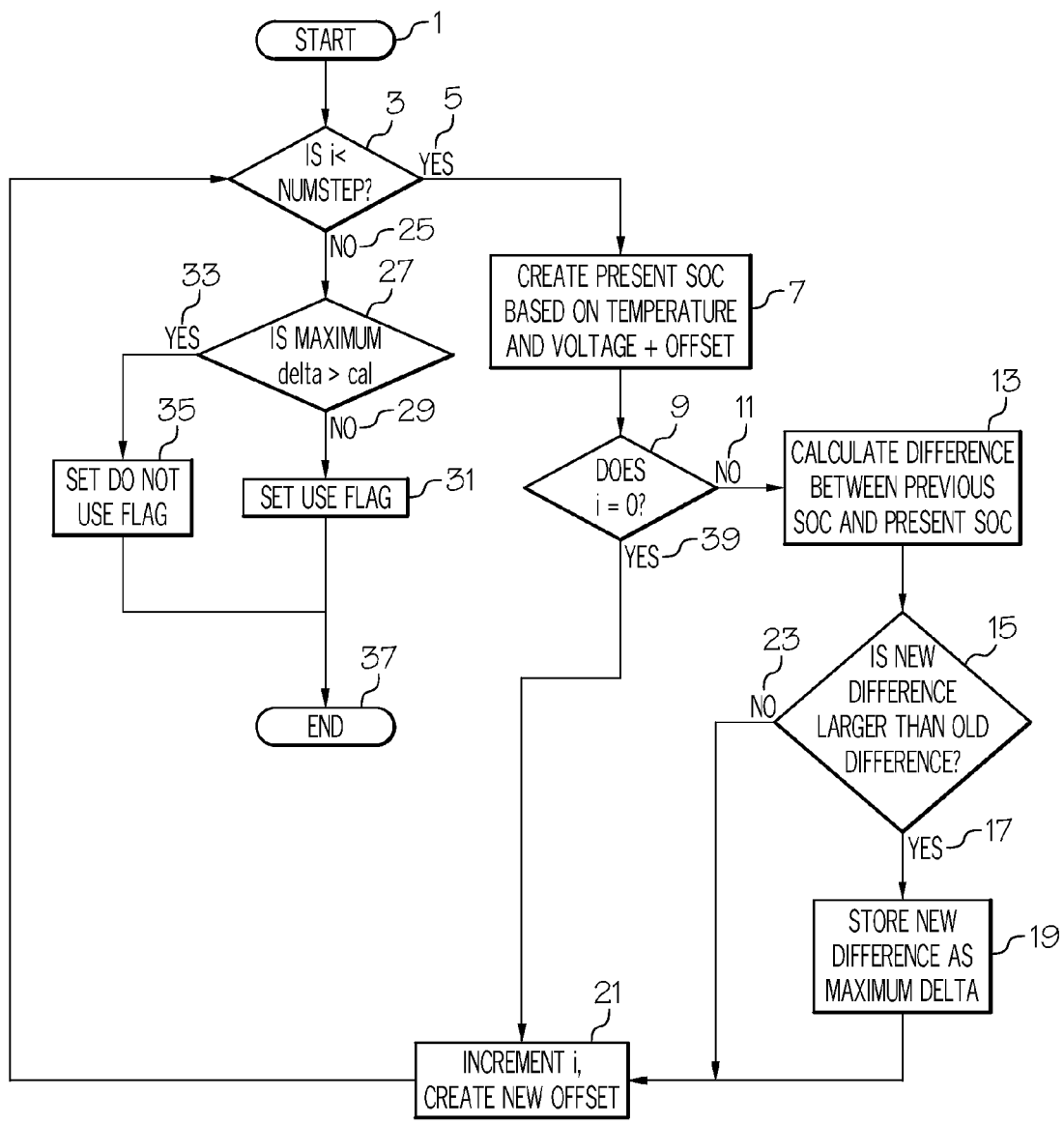
FIG. 5 is a flow diagram showing an algorithm for use with methods and systems described herein.

FIG. 5 is a schematic illustration of an embodiment showing an algorithm for use with methods and systems described herein. The algorithm runs when a determination of a battery charge is required, which can be at times automatically determined or pre-programmed into the controller 104 or an associated computer or computer system, or can be manually started. In the chart of the algorithm provided, "i" is iteration number. "NumStep" is a calibratable number of iterations to perform. "SOC" is state of charge. Offset is an addition or subtraction of a value (a correction term) and can be calculated or determined using one or more reference tables; when a voltage measurement is performed when a battery is not in equilibrium, then an offset value can be added or subtracted to correct the value, thereby providing an estimation. The algorithm can utilize an offset to make corrections to add or subtract values for more accurate determinations, such as creating SOC estimations; the values can be obtained from reference charts accessible by one or more computers running the algorithm or in communication with the controller 104 that can run the algorithm, or the values can be predetermined.

The FIG. 5 flowchart steps include as follows: Start 1, ask "Is "i" less than NumStep" 3, if "Yes" 5 create present SOC based on temperature and voltage plus offset (if required) 7, ask "Does "i" equal zero?" 9, if "No" 11 calculate the difference between previous SOC and present SOC 13; ask "Is the new difference larger than the old difference?" 15 and if "Yes" 17 then store the new difference as maximum delta 19 before the step of "Increment I, create new offset" 21. If the new difference is not larger than the old difference ("No" 23) then go directly to 21 (also go directly to 21 if the answer to 9 is "Yes" 39). After 21, repeat step 3 (Is "i" less than NumStep). The other side of the flowchart answers "No" 25 to the question of Is "i" less than Numstep 3. If "No" 25, then ask "Is the maximum delta greater than cal?" 27. If "No" 29 then set use flag 31 (output of "use the data"). If "Yes" 33 then set the do not use flag 35 (output of "not use the data"). Then the end of steps 37 is reached.

Figure 6:
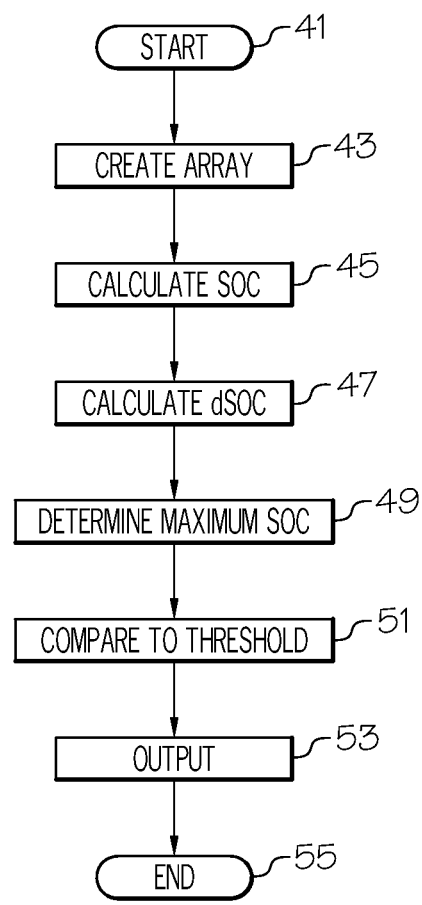
FIG. 6 is a flowchart for use with methods and systems described herein.

FIG. 6 is a schematic illustration of an embodiment showing a flowchart for use with methods and systems described herein. The chart shows that embodiments of methods and systems described herein can include the aforementioned controller 104 and an algorithm, where the controller 104 can start the algorithm so as to: create an array of voltages from the provided voltage measurement or the open-circuit voltage estimation, a step size, and a total number of elements; calculate the SOC for each voltage in the array given the sensed temperature; calculate the difference between each dSOC in the array; determine the maximum dSOC from the array; determine if the maximum dSOC is above a threshold for usable data; and to set an output to "not use the data" when the maximum dSOC is above a threshold for usable data, or setting the output to "use the data" when the maximum dSOC is not above a threshold for usable data. The step size refers to the difference between array points for SOC determinations, and can be any level automatically or manually determined and selected, such as between 0.001 volts to about 0.5 volts. Regarding the elements, the number of iterations is the number of elements in the array minus 1. Several algorithm iterations are conceived, such as from about 1 to about 10 or about 10 to about 20, about 20 to about 50 or more. Thresholds can be based on calculated or predetermined data or both, and can be set automatically or via user manual input, and can be set to account for errors of any level, including such as error percentages of 1-5 percent, or 5-20 percent, or 20-30 percent or more. The thresholds can also be based in part or in whole on comparison of line slopes such as those shown in FIG. 3 and/or FIG. 4.

The specific steps of FIG. 6 are start 41, create array 43, calculate SOC 45, calculate dSOC 47, determine maximum SOC 49, compare to threshold 51, output 53, and end 55.

The systems described herein such as controller 104 can be utilized in conjunction with computers and computer-based systems. As will be appreciated by those skilled in the art, the embodiments can be utilized with a data processing or computer system in general, and a digital computer in particular, preferably include an input, an output, a processing unit (often referred to as a central processing unit (CPU)) and memory that can temporarily or permanently store such a code, program or algorithm in the computer's memory such that the instructions contained in the code are operated upon by the processing unit based on input data such that output data generated by the code and the processing unit can be conveyed to another program or a user via output. In one form, a data-containing portion of the memory (also called working memory) is referred to as random access memory (RAM), while an instruction-containing portion of the memory (also called permanent memory is referred to as read only memory (ROM). A data bus or related set of wires and associated circuitry forms a suitable data communication path that can interconnect the input, output, CPU and memory, as well as any peripheral equipment in such a way as to permit the system to operate as an integrated whole. Such a computer system is referred to as having a von Neumann architecture (also referred to as a general purpose or stored-program computer).

In specific embodiments herein described when a threshold is exceeded, the controller 104 or a computer or computer part can communicate the signal "not use the data" to a user via a signal light such as a signal light associated with a vehicle; a signal can also be communicated to a device to display the output.

In specific embodiments described herein, the algorithm uses an SOC-OCV look-up table that varies with temperature.

In specific embodiments described herein, the algorithm takes into account rounding errors when determining error levels and threshold levels, where the rounding errors relate to A/D and/or CAN BUS.

In specific embodiments herein described, methods and systems can include one or more of: at least one battery that is a lithium-iron-phosphate battery or a battery pack from about 1 to about 10 batteries or from about 10 to about 20 batteries; a controller that can be located within a vehicle such as in a trunk or in a passenger cabin, or under a car seat; a controller that is located in a laboratory and coupled to a calculation device for running the algorithm; a step size from about 0.5 volts to about 0.1 volts or from about 0.1 volts to 0.01 about volts or from about 0.01 volts to 0.001 about volts; at least one sensor that can be one, two, or three sensors or more; sensors configured to measure temperature differences between about 1 and about 0.1 degree Celsius or between about 0.1 and about 0.01 degree Celsius, or between about 0.01 and about 0.001 degree Celsius.

EXAMPLES

The present invention will be better understood by reference to the following example which is offered by way of illustration not limitation.

Example 1

An algorithm as shown in FIG. 5 outlines specific embodiments of the current invention. Steps of the embodiments are shown below: (1) Algorithm start. This is a call of the function. The call occurs when a voltage needs to be evaluated. This voltage can be measured or estimated (2). If the number of steps is less than a calibration, proceed, otherwise skip to step (7). Step (3): Use the voltage and measured temperature to estimate a state of charge (SOC). Step (4): If this is the first time through the loop, proceed to step (6), else proceed to step (5). Step (5): Calculate the change between the previously calculated SOC and the presently calculated SOC. If this change is the largest change since the algorithm started in step 1, store this change as the maximum change. Step (6): Increment the number of steps and return to step (2). Step (7): Once all of the steps have been calculated and the maximum change in SOC has been determined, compare the maximum change in SOC to a calibration (8); If this calibration is less than the maximum change in SOC, the algorithm output that is used to signal the quality of the voltage measurement or estimation is set to "not use the data," otherwise, the output is set to "use the data." Step (9): Algorithm end. The number of iterations is recommended to be odd, with the center value of voltage in the array equal to the voltage from step 1.

An example of iterations is described as follows: a temperature of 25 degrees Celsius is sensed, with the voltage to be analyzed being 3.7 V, the number of steps 5, and the voltage step size (dV) being 0.01 volts (this value is in specific embodiments set based on Max change in SOC=1%). Multiple iterations of specific embodiments are shown as follows: Iteration 1:V=3.68 V, SOC=50%; Iteration 2:V=3.69 V, SOC=50.8%, dSOC=0.8%, maximum dSOC=0.8%; Iteration 3:V=3.7 V, SOC=51.5%, dSOC=0.7%, maximum dSOC=0.8%; Iteration 4:V=3.71 V, SOC=52.6%, dSOC=1.1%, maximum dSOC=1.1%; Iteration 5:V=3.72V, SOC=52.9%, dSOC=0.3%, maximum dSOC=1.1%; Regarding algorithm output (DataQuality), this can be set to "Do Not Use" because 1.1%>1%.

While certain representative embodiments and details have been shown for purposes of illustrating the invention, it will be apparent to those skilled in the art that various changes may be made without departing from the scope of the invention, which is defined in the appended claims.

The invention claimed is:

1. A method for determining whether a voltage measurement or an open-circuit voltage estimation is usable for a state of charge estimation for a vehicular battery, the method comprising:
    placing a controller in electrical communication with the battery, the controller comprising a memory, a processor, a vehicle control module, and an interface; and
    at least one sensor coupled to the battery;
    for sensing a temperature of the battery;
    providing at least one of the voltage measurement or the open-circuit voltage estimation for the battery;
    implementing via the processor of the controller, machine-executable instructions stored in the memory to start an algorithm
        wherein the algorithm comprises:
            creating an array of voltages from the provided voltage measurement or the open-circuit voltage estimation, a step size, and a total number of elements;
            calculating the state of charge (SOC) for each voltage in the array given the sensed temperature;
            calculating the difference between each subsequent state of charge (dSOC) in the array;
            determining the maximum dSOC from the array;
            determining if the maximum dSOC is above a threshold for usable data;
            setting an output to "not use the data" when the maximum dSOC is above the threshold for usable data, or setting the output to "use the data" when the maximum dSOC is not above the threshold for usable data; and
            communicating the output to a user via a signal light within the vehicle when the maximum dSOC is above the threshold for usable data as an indication of a need for a recharging or a replacement of the battery.

2. The method of claim 1 wherein the battery is a lithium-iron-phosphate battery.

3. The method of claim 1 wherein the battery comprises a battery pack.

4. The method of claim 1 wherein the battery comprises a battery pack comprising about 1 to about 10 batteries.

5. The method of claim 1 wherein the battery comprises a battery pack comprising about 10 to about 20 batteries.

6. The method of claim 1 wherein the controller is located between the front wheels of the vehicle, the battery comprises a battery pack located between the rear wheels of the vehicle, and multiple bus lines extending from the battery pack are configured to further provide the sensed temperature to the interface of the controller.

7. The method of claim 1 wherein the vehicle comprises a car and the controller is located at least one of in a trunk of the car, in a passenger cabin of the car or under a seat of the car.

8. The method of claim 1 wherein the controller is coupled to a calculation device for running the algorithm.

9. The method of claim 1 wherein the step size is from about 0.5 volts to about 0.1 volts.

10. The method of claim 1 wherein the step size is from about 0.1 volts to about 0.01 volts.

11. The method of claim 1 wherein the step size is from about 0.01 volts to about 0.001 volts.

12. The method of claim 1 wherein the at least one sensor is at least two sensors.

13. The method of claim 1 wherein the at least one sensor is at least three sensors.

14. The method of claim 1 wherein the at least one sensor is configured to measure temperature differences between about 1 and about 0.1 degree Celsius.

15. The method of claim 1 wherein the at least one sensor is configured to measure temperature differences between about 0.1 and about 0.01 degree Celsius.

16. The method of claim 1 wherein the at least one sensor is configured to measure temperature differences between about 0.01 and about 0.001 degree Celsius.

17. A system for determining whether a voltage measurement or an open-circuit voltage estimation is usable for a state of charge estimation for a vehicular battery comprising:
   placing a controller in electrical communication with the battery, the controller comprising a memory, a processor, a vehicle control module, and an interface; and
   at least one sensor coupled to the battery the at least one sensor configured to sense a temperature and provide the voltage measurement or the open-circuit voltage estimation of the at least one battery; and
   the controller is configured to implement, via the processor, machine-executable instructions stored in the memory to start an algorithm so as to:
      create an array of voltages from the provided voltage measurement or the open-circuit voltage estimation, a step size, and a total number of elements;
      calculate the state of charge (SOC) for each voltage in the array given the sensed temperature;
      calculate the difference between each subsequent state of charge (dSOC) in the array;
      determine the maximum dSOC from the array;
      determine if the maximum dSOC is above a threshold for usable data;
      set an output to "not use the data" when the maximum dSOC is above the threshold for usable data, or setting the output to "use the data" when the maximum dSOC is not above the threshold for usable data; and
      communicate the output to a user via a signal light within the vehicle when the maximum dSOC is above the threshold for usable data as an indication of a need for a recharging or a replacement of the battery.

18. The system of claim 17 wherein the battery comprises a lithium-iron-phosphate battery.

19. The system of claim 17 wherein the battery comprises a battery pack.

20. The system of claim 17 wherein the battery comprises a battery pack of from about 1 to about 10 batteries.

* * * * *